United States Patent [19]

Pecora et al.

[11] Patent Number: 5,245,660
[45] Date of Patent: Sep. 14, 1993

[54] SYSTEM FOR PRODUCING SYNCHRONIZED SIGNALS

[75] Inventors: Louis M. Pecora; Thomas L. Carroll, both of Alexandria, Va.

[73] Assignee: The United States of America as represented by the Secretary of the Navy, Washington, D.C.

[21] Appl. No.: 656,330

[22] Filed: Feb. 19, 1991

[51] Int. Cl.⁵ .................. H03B 29/00; G06F 1/02
[52] U.S. Cl. ........................... 380/48; 380/46; 364/717; 331/78
[58] Field of Search ............... 380/46, 48; 364/717; 331/78

[56] References Cited

U.S. PATENT DOCUMENTS

| | | | |
|---|---|---|---|
| 3,439,279 | 4/1969 | Guanella | 331/78 X |
| 3,947,634 | 3/1976 | Betts | 375/115 |
| 4,301,537 | 11/1981 | Roos | 375/1 |
| 4,799,259 | 1/1989 | Ogrodski | 380/46 |
| 4,893,339 | 1/1990 | Bright et al. | 380/28 |
| 5,007,087 | 4/1991 | Bernstein et al. | 380/46 |
| 5,048,086 | 9/1991 | Bianco et al. | 380/46 X |

OTHER PUBLICATIONS

"Secure Random Number Generation Using Chaotic Circuits", G. M. Bernstein & M. A. Lieberman, *IEEE*, pp. 37.3.1.–37.3.5, May 1989.
"Synchronization and Chaos", Y. S. Tang, Alistair I. Mees and Leon O. Chua, *IEEE Transactions on Circuits and Systems*, vol. Cas-30, pp. 620–626, Sep. 1983.
A. Chernikov et al, "Chaos: How Regular Can It Be?"; Physics Today, (Nov. 1988; pp. 27–35).
R. Matthews, "On the Derivation of a 'Chaotic' Encryption Algorithm"; Cryptologia, (Jan. 1989; vol. XIII, No. 1; pp. 29–42).

*Primary Examiner*—Bernarr E. Gregory
*Attorney, Agent, or Firm*—Thomas E. McDonnell; Barry A. Edelberg; Daniel Kalish

[57] ABSTRACT

A system for producing two synchronized signals comprises a nonlinear dynamical primary system and a nonlinear dynamical secondary response subsystem. The primary system comprises a nonlinear dynamical drive subsystem for producing at least one drive signal, and a nonlinear dynamical primary response subsystem responsive to said at least one drive signal for producing a primary signal, wherein said primary response subsystem has a complete set of at least one primary sub-Lyapunov exponents, all of said at least one primary sub-Lyapunov exponents being negative. The second response subsystem is responsive to said at least one drive signal for producing a secondary signal in synchronization with said primary signal, said secondary response subsystem being substantially a duplicate of said primary response subsystem, wherein said secondary response subsystem has a complete set of at least one secondary sub-Lyapunov exponents, all of said at least one secondary sub-Lyapunov exponents being negative.

17 Claims, 6 Drawing Sheets

SYSTEM FOR PRODUCING SYNCHRONIZED SIGNALS

FIELD OF THE INVENTION

The present invention relates generally to physical systems with dynamical characteristics, and in particular to systems for producing synchronized signals.

BACKGROUND OF THE INVENTION

The design of most man-made mechanical and electrical systems assumes that the systems exhibit linear behavior (stationary) or simple non-linear behavior (cyclic). In recent years there has been an increasing understanding of a more complex form of behavior, known as chaos, which is now recognized to be generic to most nonlinear systems. Systems evolving chaotically (chaotic systems) display a sensitivity to initial conditions, such that two substantially identical chaotic systems started with slightly different initial conditions (state variable values) will quickly evolve to values which are vastly different and become totally uncorrelated, even though the overall patterns of behavior will remain the same. This makes chaotic systems nonperiodic (there are no cycles of repetition whatsoever), unpredictable over long times, and thus such systems are impossible to synchronize by conventional methods. Y. S. Tang et al., "Synchronization and Chaos," IEEE Transactions of Circuits and Systems, Vol. CAS-30, No. 9, pp. 620–626 (September 1983) discusses the relationship between synchronization and chaotic systems in which selected parameters are outside some range required for synchronization.

SUMMARY OF THE INVENTION

It is an object of the present invention to provide methods systems for synchronizing signals, and particularly nonlinear dynamical systems.

It is another object of the present invention to provide communications systems for encryption communication utilizing synchronized nonlinear sending and receiving circuits.

It is a further object of the present invention to provide improved control devices which rely on wide-frequency band synchronized signals.

These and other objects are achieved in accordance with the present invention system for producing two synchronized signals, the system comprising:

a nonlinear dynamical primary system comprising:

a nonlinear dynamical drive subsystem for producing at least one drive signal; and a nonlinear dynamical primary response subsystem responsive to the at least one drive signal for producing a primary signal, wherein the primary response subsystem has a complete set of at least one primary sub-Lyapunov exponents, all of the at least one primary sub-Lyapunov exponents being negative; and a nonlinear dynamical secondary response subsystem responsive to the at least one drive signal for producing a secondary signal in synchronization with the primary signal, the secondary response subsystem being substantially a duplicate of the primary response subsystem, wherein the secondary response subsystem has a complete set of at least one secondary sub-Lyapunov exponents, all of the at least one secondary sub-Lyapunov exponents being negative.

These and other objects, features and advantages of the present invention are described in or apparent from the following detailed description of preferred embodiments.

BRIEF DESCRIPTION OF THE DRAWINGS

The preferred embodiments will be described with reference to the drawings, in which like elements have been denoted throughout by like reference numerals, and wherein.

DETAILED DESCRIPTION OF THE PREFERRED EMBODIMENTS

All physical systems can be described by state variables. For example, a billiard game can be described by the position and the velocity of a ball at any instant of time; and an electronic circuit can be described by all of its currents and voltages at a particular time. The invention is a tangible system which can be of any form. The state variables and associated signals can be, as further examples, pressure or other force, temperature, concentration, population, or electro-magnetic field components. The evolution of a physical system depends on the dynamical relations between the state variables, which are usually expressed as functional relations between the rates of change of the variables. Thus, most but no all physical systems are describable in terms of ordinary differential equations (ODEs). Mathematical models of chaotic systems often involve two types of systems: flows and iterative maps. The former evolve as solutions of differential equations, and the latter evolve in discrete steps, such as by difference equations. For example, seasonal measurements of populations can be modeled as iterative maps. Cf., Eckmann et al., *Rev. Mod. Phys.*, Vol. 57, pp. 617–618, 619 (1985). Some iterative maps could be considered as numerical solutions to differential equations. Solution or approximate solution of these equations, such as approximate, numerical, or analytical solution, provides information about the qualitative and quantitative behavior of the system defined by the equations.

As used herein, the synchronization of two or more evolving state variables of a physical system means the process by which the variables converge toward the same or linearly related but changing, set of values. Thus, if one synchronized variable changes by a certain amount, the change of the other synchronized variable will also approach a linear function of the same amount.

Graphically, the plot of the synchronized variables against each other as they evolve over time would approach a straight line.

Figure 1:
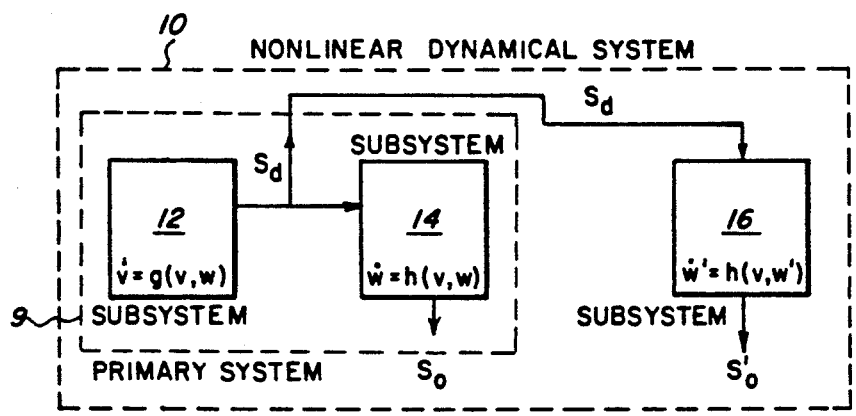
FIG. 1 is a general block diagram of a nonlinear dynamical physical system according to the present invention.

Referring to FIG. 1, an n-dimensional autonomous nonlinear dynamical primary system 9 can be arbitrarily divided, as shown, into first and second parts or subsystems 12 and 14, each of which subsystems is also a nonlinear dynamical system. Primary system 9 and more specifically, subsystem 14, has output signal $S_0$.

The following discussion involves mathematical modeling of the system 10 in terms of solutions to differential equations and provides theoretical support for the invention. However, it not necessary in practicing this invention that system 10 be susceptible to such modeling. For example, as stated earlier, some iterated maps cannot be modeled as solutions to differential equations, and yet this invention encompasses systems evolving according to iterated maps. As a further example, it is impractical to accurately model an ideal gas by individually considering the position and momentum of every molecule because of the vast number of molecules and variables involved.

This discussion about mathematic modeling is in two parts to correspond to two sources of difficulty in synchronizing signals: instability within a single system (chaos) and instability between two systems (structural instability). It is understood that both discussion apply to this invention and neither part should be read separately as limiting the practice of this invention.

A system with extreme sensitivity to initial conditions is considered chaotic. The same chaotic system started at infinitesimally different initial conditions may reach significantly different states after a period of time. As known to persons skilled in the art and discussed further, for example, in Wolf et al., Determining Lyapunov Exponents from a Timer Series, Physica, Vol. 16D, p 185 et seq. (1985), Lyapunov exponents (also know in the art as "characteristic exponents") measure this divergence. A system will have a complete set (or spectrum) of Lyapunov exponents, each of which is the average exponential rate of convergence (if negative) or divergence (if positive) of nearby orbits in phase space as expressed in terms of appropriate variables and components. If all the Lyapunov exponents are negative, then the same system started with slightly different initial conditions will converge (exponentially) over time to the same values, which values may vary over time. On the other hand, if at least one of the Lyapunov exponents is positive, then the same system started with slightly different initial conditions will not converge, and the system behaves chaotically. It is also known by persons skilled in the art that "in almost all real systems there exist ranges of parameters or initial conditions for which the system turns out to be a system with chaos . . ." Chernikov et al., Chaos: How Regular Can It Be?, 27 Phys. Today 27, 29 (Nov. 1988).

Primary system 9 can be described by the ODE $$du(t)/dt = f(u(t)) \text{ or } \dot{u} = f(u) \tag{1}$$

where u(t) are the n-dimensional state variables.

Defined in terms of the state variables v and w for subsystems 12 and 14, respectively, where u=(v,w), the ODEs for subsystems 12 and 14 are, respectively:

$$\dot{v} = g(v,w)$$

$$\dot{w} = h(v,w) \tag{2}$$

where v and w are m and n-m dimensional, respectively, that is,
where $v=(u_1, \ldots, u_m)$, $g=(f_1(u) \ldots, f_m(u))$, $w=(u_{m+1}, \ldots, u_n)$ and $h=(f_{m+1}(u), \ldots, f_n(u))$ The division of primary system 9 into subsystems 12 and 14 is truly arbitrary since the reordering of the $u_i$ variables before assigning them to v, w, g and h is allowed.

If a new subsystem 16 identical to subsystem 14 is added to primary system 9, thereby forming system 10, then substituting the variables v for the corresponding variables in the function h augments equations (2) for the new three-subsystem system 10 as follows:

$$\dot{v} = g(v,w) \tag{3}$$

$$\dot{w} = h(v,w)$$

$$\dot{w}' = h(v,w')$$

Subsystem 16 has output signal S'.

The w and w'subsystems (subsystems 14 and 16) will only synchronize if $\Delta w \to 0$ as $T \to \infty$.) where $\Delta w = 2'-w$.
The rate of change of $\Delta w$ (for small $\Delta w$) is:

$$\Delta \dot{w} = d\Delta w/dt = h(v,w') = D_w h(v,w)\Delta w + W; \tag{4}$$

where $D_w h(v,w)$ is the Jacobian of the w subsystem vector field with respect to w only, that is: an $(n-m) \times (n-m)$ linear operator (matrix)

$$(D_w h)_{ij} = \partial h_i/\partial w_j \tag{5}$$

When for $(m+1) \leq i \leq n$ and $1 \leq j \leq (n-31\ m)$, and where W is a nonlinear operator. Equation 4 is divided by $|\Delta w(o)|$, and $\xi = \Delta w(t)/\Delta w(0)$, an an equation for the rate of change (the growth or shrinkage) of the unit displacement (n−m) dimensional vector, $\xi$, is obtained. In the infinitesimal limit, the nonlinear operator vanishes and this leads to the variational equation for the subsystem $$d\xi/dt = D_w h(v(t), w(t))\xi. \tag{6}$$

The behavior of this equation or its matrix version, using the usual fundamental matrix approach, depends on the Lyapunov exponents of the w subsystem. These are hereinafter referred to as sub-Lyapunov exponents to distinguish them from the full Lyapunov spectrum of the (v,w)=(u) system. Since the w subsystem 14 is driven by the v subsystem 12, the sub-Lyapunov exponents of the w subsystem 14 are dependent on the m dimensional v variable. If at least one of the sub-Lyapunov exponents is positive, the unit displacement vector $\xi$ will grow without bounds and synchronization will not take place. Accordingly, the sub-systems 14 and 16 (w and w') will synchronize only if the sub-Lyapunov exponents are all negative. This principle provides a criterion in terms of computable quantities (the sub-Lyapunov exponents) that is used to design synchronizing systems in accordance with the present invention.

The $v=(v_1, \ldots, v_m)$ components (subsystem 12) can be viewed more broadly as driving variables and the $w'=(w'_{m+1}, \ldots, w'_n)$ components (subsystem 16) as responding variables. The drive system 9 (v,w) can be viewed as generating at least one drive signal $S_d$, in the formula v(t), which are applied to the response systems w and w' (subsystem 14 and 16, respectively) to synchronize the drive system and the response system outputs. This is the approach taken in accordance with the present invention to provide synchronized nonlinear dynamical systems.

In practicing this invention, the above discussion applies to identical subsystems 14 and 16. This might be achievable, for example, in digital systems. In such systems 10, the signals $S_0$ and $S_0'$ may each be chaotic because the system 9 might be chaotic. They may differ because of different initial conditions in subsystems 14 and 16. However, they will approach each other ($\Delta w \rightarrow 0$) because systems 14 and 16 are stable (that is, with all negative sub-Lyapunov exponents) when considered as driven by the same at least one drive signal $S_d$.

In most physical systems, subsystems 14 and 16 are not identical. For example, two electrical components with the same specification typically do not have identical characteristics. The following explanation based on mathematical modeling shows that the signals $S_0$ and $S_0'$ will nevertheless be synchronized if both subsystems 14 and 16 have negative sub-Lyapunov exponents.

According to this mathematical model, the synchronization is affected by differences in parameters between the w and w' systems which are found in real-life applications. Let $\mu$ be a vector of the parameters of the w subsystem (subsystem 14) and $\mu'$ of the w' subsystem (subsystem 16), so that $h = h(v, w, \mu)$, for example. If the w subsystem were one-dimensional, then for small $\Delta w$ and small $\Delta \mu = \mu' - \mu$:

$$\Delta \dot{w} \approx h_w \Delta w + h_\mu \Delta \mu \qquad (7)$$

where $h_w$ and $h_\mu$ are the partial derivatives of h with respect to w and $\mu$, respectively. Roughly, if $h_w$ and $h_\mu$ are nearly constant in time, the solution of this equation will follow the for formula $$\Delta w(t) = \left[ \Delta w(0) + \frac{h_\mu \cdot \Delta \mu}{h_w} \right] e^{h_w t} - \frac{h_\mu \cdot \Delta \mu}{h_w}$$

If $h_2 < 0$, the difference between w and w' will level off at some constant value and the systems will be synchronized. Although this is a simple one dimensional approximation, it turns out to be the case for all systems that have been investigated numerically, even when the differences in parameters are rather large ($\sim$10-20%). This is also the case in the exemplary electronic synchronizing circuit described in more detail hereinbelow.

Figure 6:
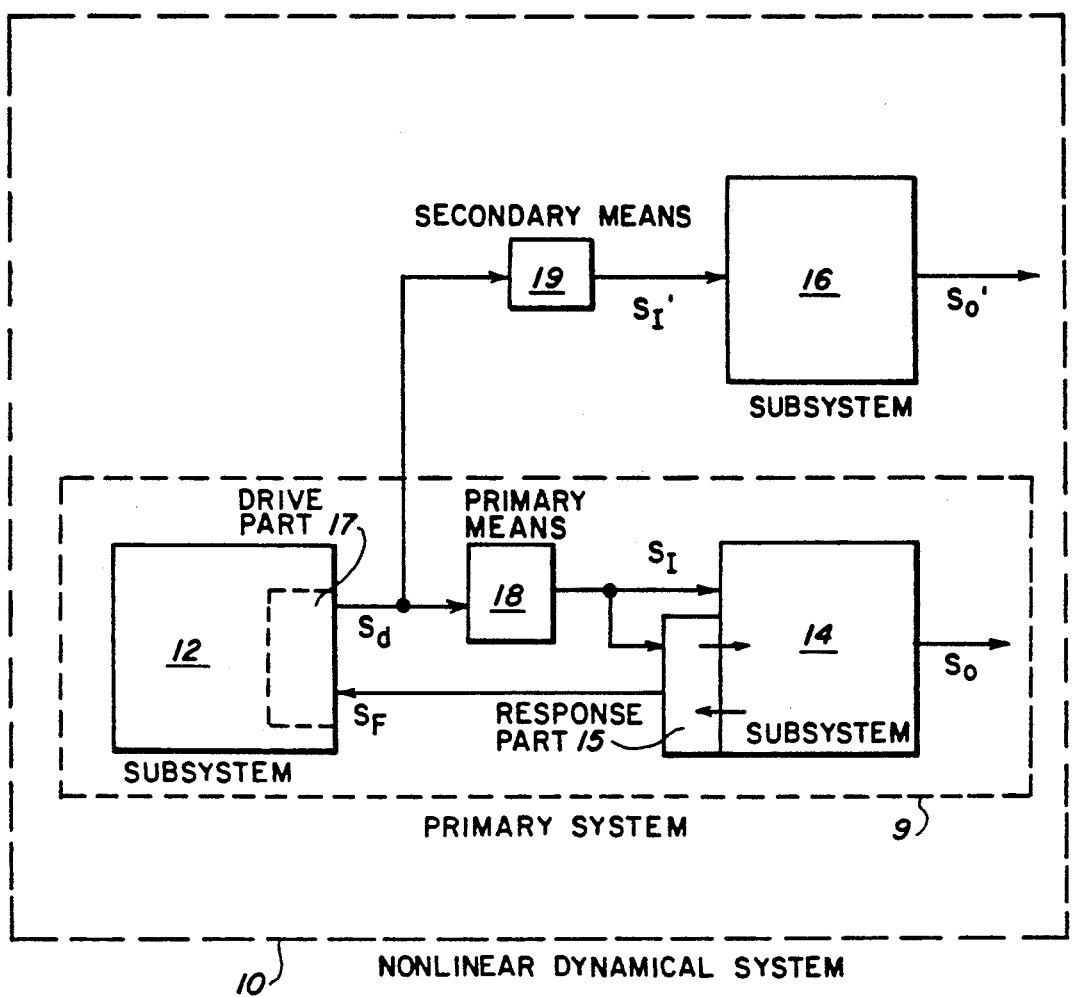
FIG. 6 is a general block diagram of an embodiment according to the present invention.

Since m-dimensional variable v may be dependent on (n-m)-dimensional variable w, there may be feedback from subsystem 14 to subsystem 12. As shown in FIG. 6, a response part 15 of subsystem 14 may produce a feedback signal $S_F$ responsive to the m-dimensional driving variable v, and a drive part 17 of subsystem 12 may respond to the feedback signal $S_F$ to produce the at least one drive signal $S_d$.

As shown in FIG. 6, subsystems 14 and 16 need not be driven by the same at least one drive signal $S_d$ but could be driven by at least one input signals $S_I$ and $S_I'$ responsive to the at least one drive signal $S_d$. System 10 could have primary and secondary means 18 and 19, respectively, coupled to subsystem 12 and responsive to the at least one drive signal $S_d$ for generating input signals $S_I$ and $S_I'$, respectively. If these primary and secondary means 18 and 19, respectively are linearly responsive to the at least one drive signal $S_d$, then the above mathematical analysis would continue to apply since linear transformations do not affect the signs of the sub-Lyapunov exponents.

In accordance with the present invention, in order to develop electrical circuits, for example, which have chaotic dynamics, but which will synchronize, a nonlinear dynamical circuit (the driver subsystem) is duplicated (to form a response subsystem). A selected portion of the response circuit is removed, and all broken connections are connected to voltages produced at their counterparts in the drive circuit. These driving voltages constitute the at least one drive signal shown in FIG. 1, and advantageously are connected to the response circuit via a buffer amplifier to ensure that the drive circuit is not affected by the connection to the response circuit, i.e., it remains autonomous.

Figure 2:
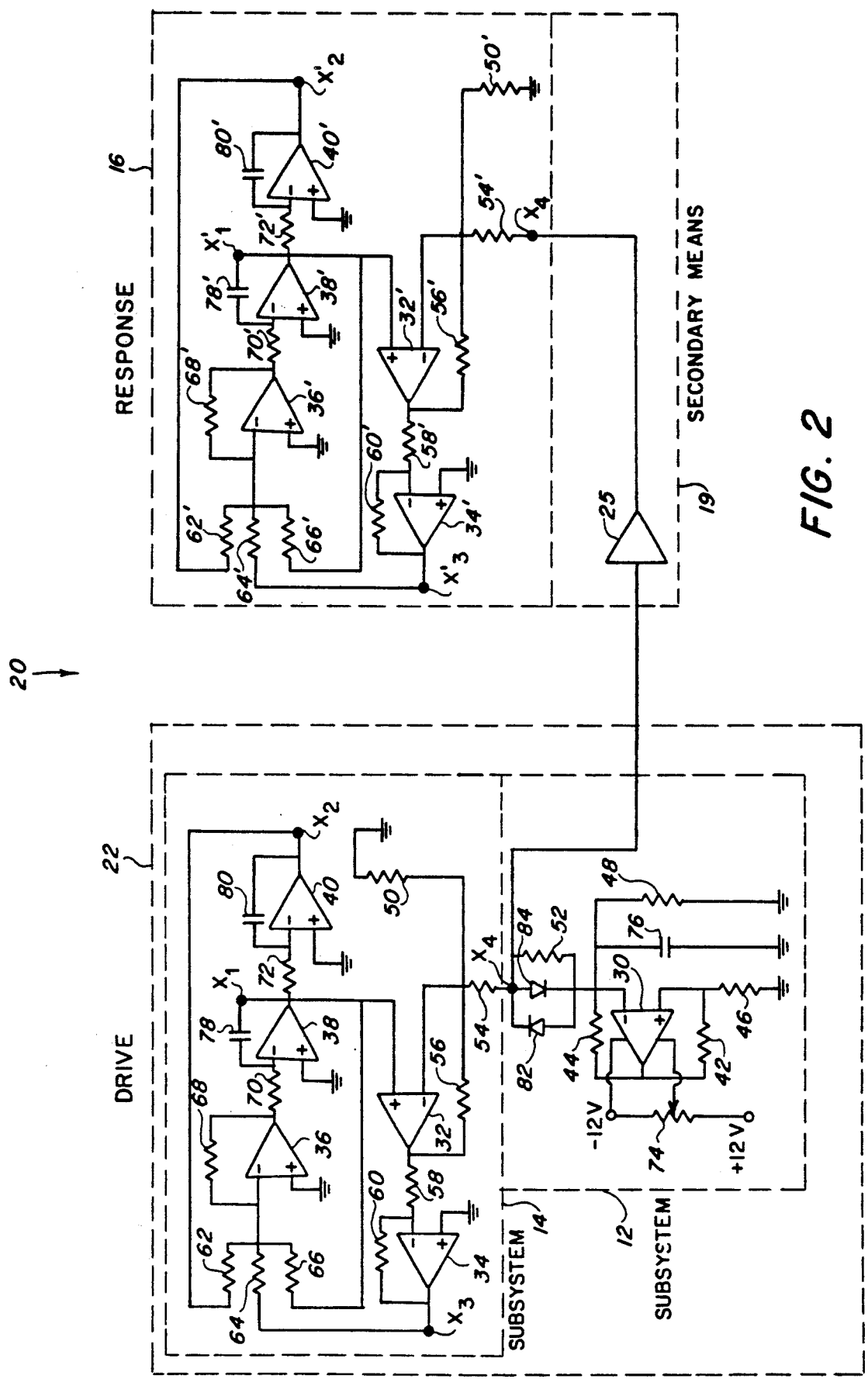
FIG. 2 is a schematic circuit diagram of a synchronized chaotic circuit system constructed in accordance with the present invention.

As a specific example, FIG. 2 shows an electrical circuit system 20 constructed in accordance with the present invention which has two synchronized nonlinear dynamical subsystems, a drive circuit 22 and a response circuit 16. Circuits 22 and 16 correspond to the u and w' systems, respectively, discussed above.

Drive circuit 22 comprises a hysteretic circuit formed by a differential amplifier 30, resistors 42, 44, 46, 48, 50 and 52; potentiometer 74; capacitor 76; and diodes 82 and 84 connected as shown; and an unstable oscillator circuit formed by differential amplifiers 32, 34, 36, 38 and 40; resistors 58, 60, 62, 64, 66, 68, 70 and 72; and capacitors 78 and 80 connected as shown. In an experimental implementation of circuit system 20 which has been successfully tested, amplifiers 30-40 were MM741 operations amplifiers, and diodes 82 and 84 were 1N4739A diodes. Component values for the resistors and capacitors which were used are set forth in the following table:

| | |
|---|---|
| Resistor 42 = 10KΩ | Resistor 64 = 150KΩ |
| Resistor 46 = 10KΩ | Resistor 66 = 150KΩ |
| Resistor 48 = 20KΩ | Resistor 68 = 330KΩ |
| Resistor 50 = 100KΩ | Resistor 70 = 100KΩ |
| Resistor 52 = 50KΩ | Resistor 72 = 100KΩ |
| Resistor 54 = 3KΩ | Potentiometer 74 = 10kΩ |
| Resistor 56 = 20KΩ | Capacitor 76 = 0.01 μF |
| Resistor 58 = 100KΩ | Capacitor 78 = 0.01 μF |
| Resistor 60 = 100KΩ | Capacitor 80 = 0.001 μF |
| Resistor 62 = 220KΩ | |

Drive circuit 22 can be subdivided into two subparts 14 and 12. Although the illustrative subparts 14 and 12 shown in FIG. 2 correspond to the two circuits forming drive circuit 22, this is not necessary, and the division of a given drive circuit into subparts in order to determine the proper configuration for a synchronized response circuit is made in accordance with the analysis described herein. Subpart 14 corresponds to the w subsystem (subsystem 14 in FIG. 1), and subpart 12 corresponds to the v subsystem described above. Those parts of subpart 14 which affect the signal at $X_4$ and those parts of subpart 12 responsive thereto, respectively, constitute response parts 15 (FIG. 6) and drive part 17 (FIG. 6), to provide feedback. Response circuit 16 is substantially a duplicate of subpart 14 of drive circuit 22 (the specifications for primed components, such as resistor 50', is the same as the specification for unprimed components, such as resistor 50) and corresponds to subsystem w' (subsystem 16) described hereinabove. Signals $X_1$, $X_2$, $X_3$ and $X_4$ are characteristic voltages of drive circuit 22. The signal $X_4$ is connected as drive signal $S_d$ through a buffer amplifier 25, which ideally is an operational amplifier having linear characteristics such as an AD381 manufactured by Analog Devices, to response circuit 16 at the junction in circuit 16 corresponding to the junction in circuit 22 at which the signal $X_4$ is generated. Signal $X_4$ replaces the circuitry (subpart 12) of drive circuit 22 which is missing in response circuit 16. The subsystem of buffer amplifier 25 is the secondary means 19.

Drive circuit 22 is an autonomous system and behaves chaotically. It can be modeled by the following equations of motion for the three voltages $X_1$, $X_2$ and $X_3$ shown in FIG. 2.

$$\dot{X}_1 = X_2 + \gamma X_1 + cX_3$$
$$\dot{X}_2 = -\omega_2 X_1 - \delta_2 X_2 \qquad (9)$$
$$\epsilon \dot{X}_3 = (1-X_3)^2(sX_1 - r + X_3) - \delta_3 X_3,$$

where $\gamma = 0.12$, $C = 2.2$, $\omega_2 = 10.0$, $\delta_2 = \delta_3 = 0.001$, $\epsilon = 0.001$, $s = 1/6$, and $r = 0.0$.

An analysis of the sub-Lyapunov exponents for the response circuit 16 requires a transformation of the equations of motion from the ($X_1$, $X_2$, $X_3$) system to the ($X_1 X_2$, $X_4$) system. This is done by analyzing the circuit, and finding that $X_3 = \alpha X_4 - \beta X_1$ where $\alpha = 6.6$ and $\beta = 7.9$. This gives the following equations of motion:

$$X_1 = X_2 + \lambda X_1 + c(\alpha X_4 - \beta X_1)$$
$$X_2 = -\omega_2 X_1 - \delta_2 X_2 \qquad (10)$$
$$\epsilon X_4 = (1/\alpha)\{(1-(\alpha X_4 \beta X_1)^2)(sX_1 - r + \alpha X_4 - \beta X_1) - \delta_3 \alpha X_4 - \beta X_1 - \beta X_2 - \beta \lambda X_1 - \beta c(\alpha X_4 - \beta X_1)\}$$

The equations of motion for the response are just the $X_1$ and $X_2$ equations. The sub-Lyapunov exponents are calculated directly from the Jacobian of the $X_1$ and $X_2$ equations, which is a constant in this case. It will be appreciated that conventional methods for calculating Lyapunov exponents, as analytical, measurement, numerical and otherwise, can be used, such as, for example, those described by Eckmann et al., *Rev. Mod. Phys.*, Vol. 57, p.617 et seq. (1985); Lichtenberg et al., *Regular and Stochastic Motion*, Springer-Verlag, New York (1983); Rashband, *Chaotic Dynamics of Nonlinear Systems*, John Wiley and Sons, New York (1990); and Wolf et al., *Physica.* Vol. 16D, p. 285 et seq. (1985). The sub-Lyapunov exponents in this case are $-16.587$ and $-0.603$, implying that synchronization of the two electrical circuits 22 and 16 will $X_4$ is the drive signal $S_d$ for the response subsystems and ($X_1$, $X_2$) and ($X_1'$, $X_2'$) are the synchronized signals $S_0$ and $S_0'$.

Circuit 22 itself runs in the realm of a few hundred Hz. Response circuit 16 synchronizes with drive circuit 22 within about two milliseconds. It has been observed experimentally that small changes ($\sim 10\%$) of the circuit parameters do not affect synchronization greatly, in that the response voltages still remain close to their counterparts in drive circuit 22; but larger changes ($\sim 50\%$) do. Even though the sub-Lyapunov exponents for the larger changes both remain negative, the response voltages no longer remain close to their drive counterparts.

The circuit of FIG. 2 has been used to transmit a pure frequency signal hidden in a chaotic signal as follows. With circuits 22 and 16 operating in a synchronized mode, a sine wave of a few hundred Hz was added to the $X_2$ signal from the drive circuit and sent to the response circuit. The $X_2'$ signal produced by response circuit 16 was then subtracted from the sum of the $X_2$ signal and the sine wave, thereby extracting the sine wave from the chaotic signal. Spectral analysis of the ($X_2$+sine wave) combination signal showed that the sine wave could not be detected in the chaos of the $X_2$ signal. The smallest sine wave that could be extracted this way was approximately 40 millivolts peak to peak compared to a two volt peak to peak $X_2$ signal, or a 50:1 ratio of chaotic signal to sine wave.

Many other possible choices for the drive circuit are possible and may require transformation of the circuit equations to model them. This can be determined as described hereinabove for nonlinear circuits by analyzing the circuit dynamics in terms of the sub-Lyapunov exponents to determine which signal(s) to choose as a drive signal or signals, and which subcircuit is to be used as a model for the response circuit.

Figure 7:
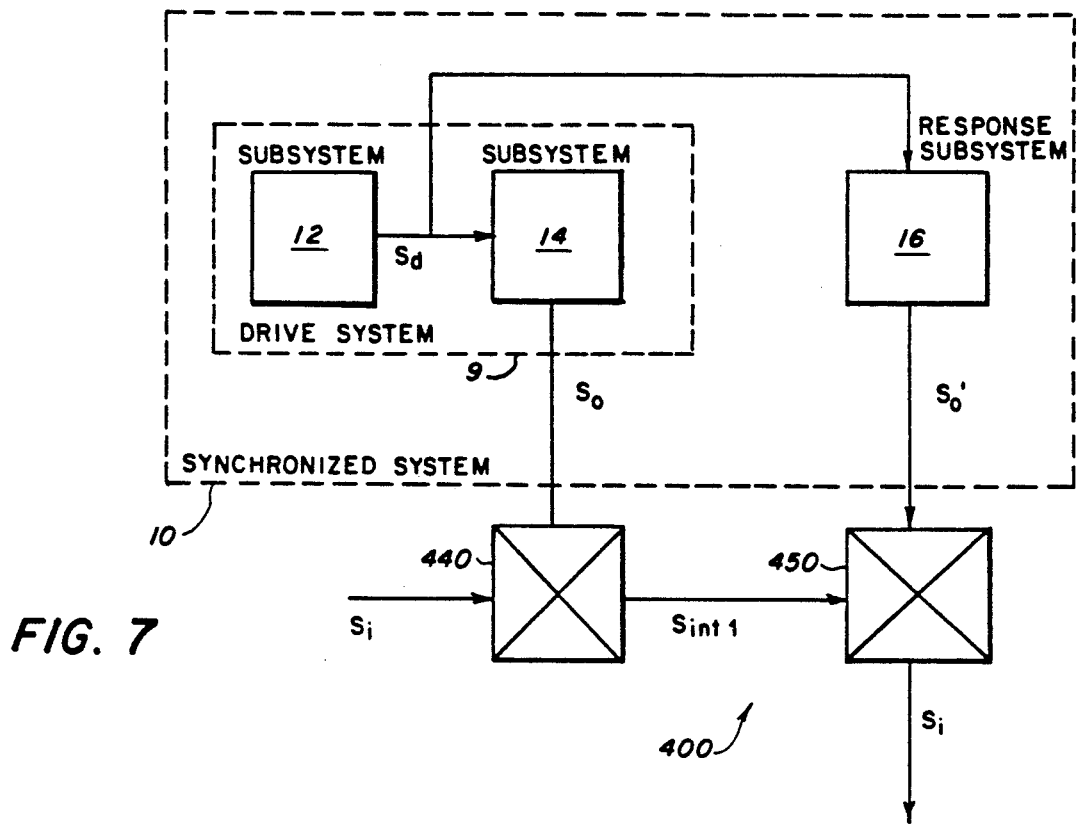
FIG. 7 is a general block diagram of an application of the present invention to encryption.

Referring to FIGS. 3-5 and 7-8, more practical communications systems for encrypted communication which incorporate and apply the synchronized system of FIGS. 1, 2 and 7 will now be described.

As shown in FIG. 7, the synchronized system 10 with drive system 9, subsystems 12 and 14 and response subsystem 16 form part of this system 400. A first combiner 440 coupled to subpart 14 then combines an information signal $S_i$ with the signal $S_0$ form subpart 14 t form at least one first intermediate signal $S_{int1}$. A deriver 450 coupled to subpart 16 is responsive to the first intermediate signal $S_{int1}$ and the signal $S_0'$ from subpart 16 so as to derive the information signal $S_i$. It will be appreciated that other embodiments of synchronized system 10 discussed above, including those shown in FIG. 6, can be included in this encryption application.

Figure 3:
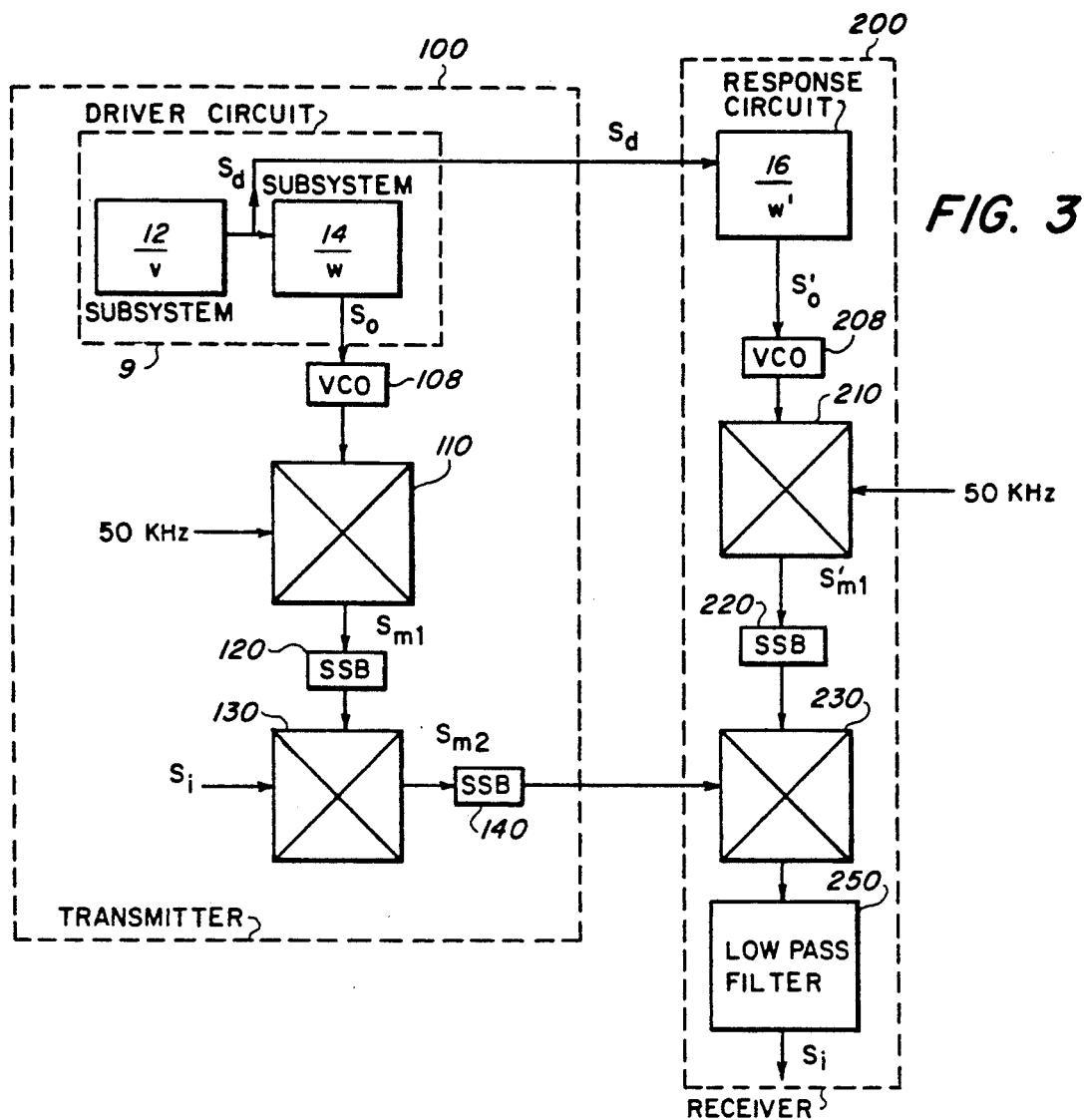
FIG. 3 is a first embodiment of an encrypted communication system constructed in accordance with the present invention which uses the system of FIG. 1.

As an example of the application shown in FIG. 7, referring to FIG. 3, driver circuit a of FIG. 1 forms part of a transmitter 100 and response circuit 16 of FIG. 1 forms part of a receiver 200. Drive signal(s) $S_d$ is(are) transmitted to response circuit 16 in any desired conventional wired or wireless fashion. Circuits 9 and 16 respectively generate low frequency synchronized chaotic signals $S_0$ and $S_0'$. Signals $S_0$ and $S_0'$ are respectively converted to frequency signals in amplitude to frequency converters 108 and 208 (e.g., voltage controlled oscillators), and the converted signals respectively combined in a multiplier 110 and a multiplier 210 with a 50 KHz carrier to produce first modulated chaotic signals $S_{m1}$ and $S_{m1}'$. (It will be appreciated that the transmission frequency is determined in accordance with the system requirements, the desired bandwidth, and the like. It will also be appreciated that if a circuit configuration is selected for driver circuit 9 and response circuit 16 which produces chaotic signals at a sufficiently high frequency, it is not necessary to modulate a separate carrier signal in order to obtain signals $S_{m1}$ and $S_{m1}'$.) The upper side-band of signal $S_{m1}$ is selected by a single sideband selector 120 and further modulated with an information signal $S_i$ of 600 Hz (a frequency within the range of signal $S_0$) in a multiplier 130 to produce a second modulated chaotic signal $S_{m2}$. The upper sideband of signal $S_{m2}$ is selected by a single sideband selector 140 and sent to receiver 200 in any conventional fashion, where it is modulated in a multiplier 230 by the upper side band of signal $S_{m1}'$ selected by a single side-band selector 220. The output of multiplier 230 consists of the sums and differences of the input frequencies. The difference part gives the information signal ($\sim 600$ Hz) and the sum part gives a signal centered around 50 KHz. The output of multiplier 230 is filtered in a low bandpass filter 250 to yield the demodulated information signal. It will be appreciated that information is effectively encrypted by being hidden in the chaotic signals which are transmitted. The at least one drive signal $S_d$ serves as a "key" to the receiver to extract the information from the chaos.

Figure 4:
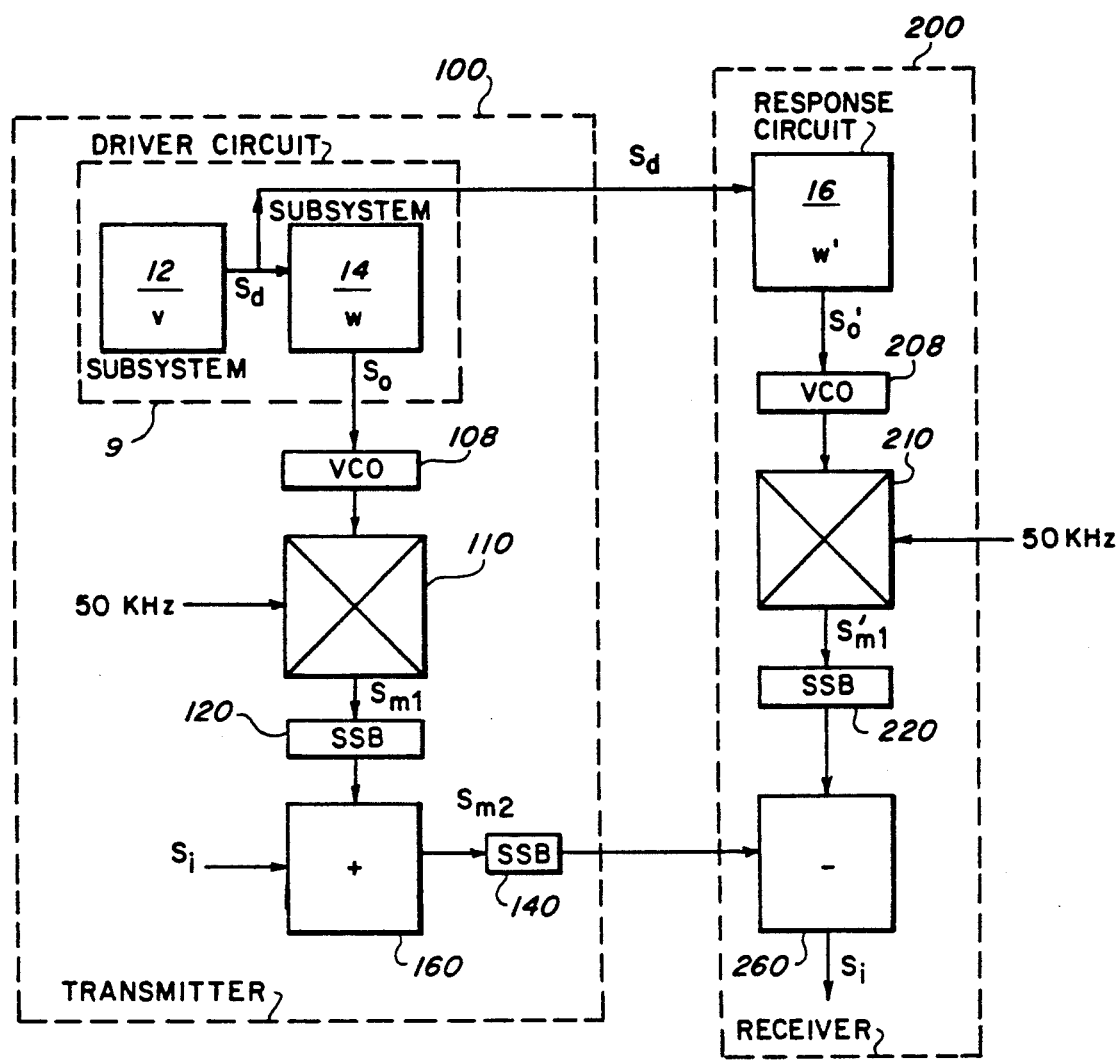
FIG. 4 is a second embodiment of an encrypted communication system constructed in accordance with the present invention which uses the system of FIG. 1.
Figure 8:
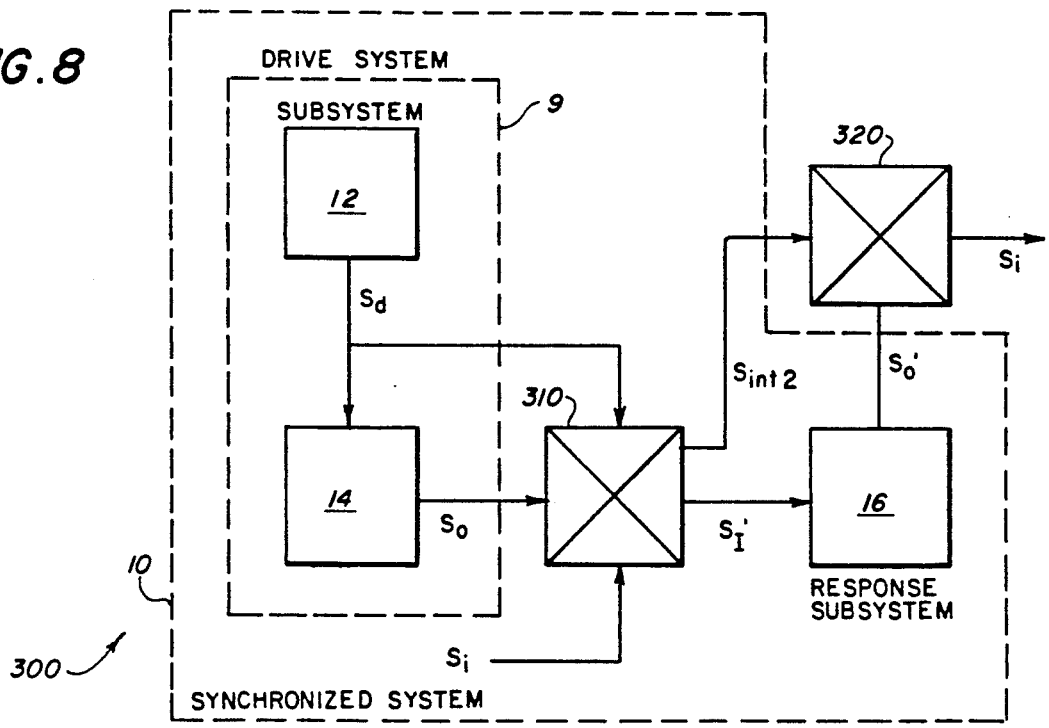
FIG. 8 is a general block diagram of another application of the present invention to encryption.

The communication system of FIG. 4 is similar to that of FIG. 3, except that the information signal $S_i$ is added to the upper side-band of signal $S_{m1}$ in an adder 160, and the upper side-band of signal $S_{m1}'$ is subtracted from the transmitted form of signal $S_{m2}$ in a subtractor 260 in receiver 200. FIG. 8 shows another application of the present invention to communication encryption. This embodiment differs from that shown in FIG. 7 in that the information signal $S_i$ is added to the signal driving subsystem 16. The synchronized system 10 with drive system 9, subsystems 12 and 14, and response system 16 form part of this system 300. A second combiner 310 corresponds to the secondary means 19. It combines the at least one drive signal $S_d$, output $S_0$ from subpart 14 and an information signal $S_i$ to produce at least one second intermediate signal $S_{int2}$ and at least one input signal $S_I'$. A second deriver 320 coupled to subpart 16 is responsive to the at least one second intermediate signal $S_{int2}$ and signal $S_0'$ from subpart 16 so as to derive the information signal $S_i$.

Figure 5:
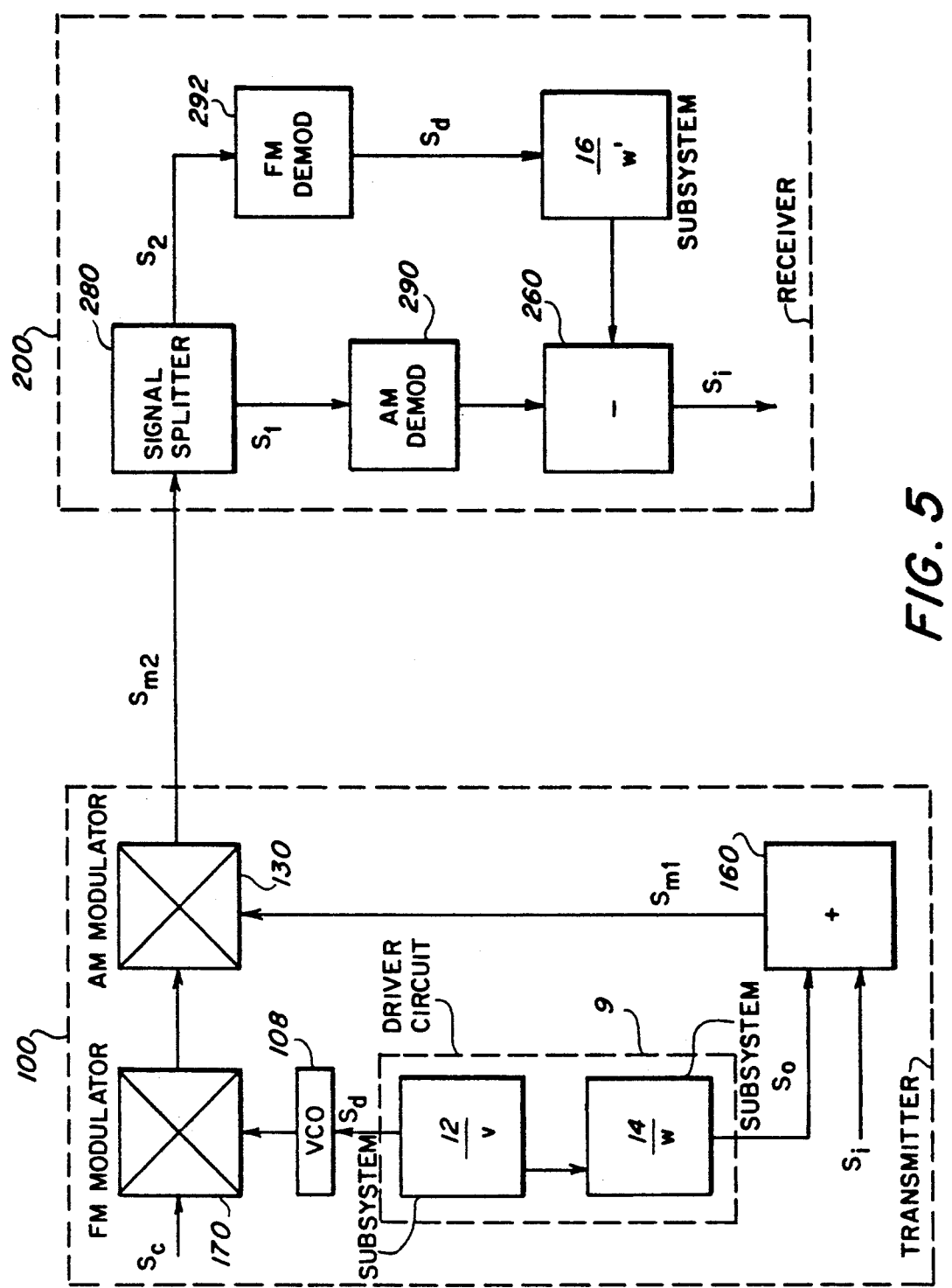
FIG. 5 is a third embodiment of a communication system constructed in accordance with the present invention which uses the system of FIG. 1.

An example of the system shown in FIG. 8 is shown in FIG. 5, in which at least one drive signal $S_d$ and the information carrying chaotic carrier signal are transmitted as part of a pure frequency carrier which is frequency modulated with at least one drive signal $S_d$ and amplitude modulated with the chaotic carrier signal. Specifically, transmitter 100 comprises a frequency modulation (FM) modulator 170 for modulating a pure frequency carrier $S_c$ having a frequency higher than any frequencies found in the at least one drive signal $S_d$ and the modulated chaotic carrier signal with at least one drive signal $S_d$; an adder 160 for adding an information signal $S_i$ to signal $S_0$ to produce first modulated signal $S_{m1}$; and a multiplier 130 for amplitude modulation of the output of modulator 170 with signal $S_{m1}$ to produce a second modulated signal $S_{m2}$ for transmission to receiver 200. Receiver 200 comprises a signal splitter 280 for dividing the received signal $S_{m2}$ into two equal signals $S_1$ and $S_2$; an amplitude demodulator 290 for amplitude demodulating signal $S_1$ and a frequency demodulator 292 for frequency demodulating signal $S_2$. The output of demodulator 292 is fed as at least one drive signal $S_d$ to response circuit 16, and the outputs of demodulator 290 and response circuit 16 are subtracted in a subtractor 260 to extract the information signal $S_1$.

It will be appreciated that variants of the foregoing methods are possible. For example, two modulated chaotic carrier signals $S_{m21}$ and $S_{m22}$ with low mutual correlations can be produced and combined in transmitter 100 and the information on each carrier can be separated in receiver 200 by multiplication of the received signals corresponding to $S_{m21}$ and $S_{m22}$ with the synchronized counterparts $S_{m11}'$ and $S_{m12}'$ of the chaotic carrier signals $S_{m11}$ and $S_{m12}$, and filtering the resultant signals with a low pass filter as in the embodiment of FIG. 3.

It will also be appreciated that the present invention is applicable to any system which requires synchronization of remote signals and/or their low correlation with each other. For example, the present invention is particularly suited for use in control devices relying on wide-frequency-band synchronized signals.

The foregoing descriptions of the preferred embodiments are intended to be illustrative and not limiting. It will be appreciated that numerous modifications and variations can be made without departing from the spirit or scope of the present invention.

What is claimed is:

1. A synchronized nonlinear electrical system for producing first and second system outputs which are synchronized with respect to each other, said system comprising:

a first part for producing said first system output comprising a plurality of first interconnected components defined by a set of variables having rates of change which are functionally interrelated and producing a set of intermediate outputs at junctions between said first interconnected components; and a second part for producing said second system output in response to a selected at least one of said intermediate outputs, said second part comprising a plurality of second interconnected components corresponding to a subpart of said first part selected so that the sub-Lyapunov exponents of the second part are all negative when the second part is driven by said selected at least one intermediate response applied at the at least one component junction in said second part corresponding to the at least one component junction in said first part at which said selected at least one intermediate response is produced.

2. The system of claim 1 wherein said first and second parts are electrical circuits producing electrical output signals as said first and second output responses.

3. The system of claim 2, wherein:

said first part comprises first chaotic circuit means for generating a first chaotic signal;

said second part comprises second chaotic circuit means corresponding to a subpart of said first chaotic circuit means for generating a second chaotic signal synchronized with said first chaotic signal in response to a selected at least one driving signal produced by said first chaotic circuit; and said system further comprises means for modifying said first chaotic signal with an information signal to produce a chaotic carrier signal; and means for processing said chaotic carrier signal responsive to said second chaotic signal to drive said information signal.

4. The system of claim 1, wherein:

said first part comprises first chaotic circuit means for generating a first chaotic signal;

said second part comprises second chaotic circuit means corresponding to a subpart of said first chaotic circuit means generating a second chaotic signal synchronized with said first chaotic signal in response to a selected at least one driving signal produced by said first chaotic circuit; and said system further comprises means for producing a carrier signal; means for modifying said carrier signal with said chaotic signal to produce a first chaotic carrier signal; means for modifying said chaotic carrier signal with an information signal to produce a second chaotic carrier signal; means for producing a third chaotic carrier signal responsive to said second chaotic signal; and means for processing said second chaotic carrier signal responsive to said third chaotic carrier signal to derive said information signal.

5. A synchronized nonlinear electrical system comprising:
 a) a nonlinear dynamical primary system comprising:
   i) a nonlinear dynamical drive subsystem for producing at least one drive signal; and
   ii) a nonlinear dynamical primary response subsystem responsive to said at least one drive signal for producing a primary signal, said primary response subsystem having a complete set of at least one primary sub-Lyapunov exponents, all of said at least one primary sub-Lyapunov exponents being negative; and
 b) a nonlinear dynamical secondary response subsystem responsive to said at least one drive signal for producing a secondary signal in synchronization with said primary signal, said secondary response subsystem being substantially a duplicate of said primary response subsystem, wherein said secondary response subsystem has a complete set of at least one secondary sub-Lyapunov exponents, all of said at least one secondary sub-Lyapunov exponents being negative.

6. The system according to claim 5 further comprising:
 primary means coupled to said primary system being responsive to said at least one drive signal for generating at least one primary input signal; and
 wherein said primary response subsystem comprises means responsive to said at least one primary input signal for producing said primary signal.

7. The system according to claim 6 wherein said primary means is linearly responsive to said at least one drive signal.

8. The system according to claim 6 further comprising:
 secondary means coupled to said primary system being responsive to said at least one drive signal for generating at least one secondary input signal; and
 wherein said secondary response subsystem comprises means responsive to said at least one secondary input signal for producing said secondary signal.

9. The system according to claim 8 wherein said secondary means is linearly responsive to said at least one drive signal.

10. The system according to claim 9 wherein said primary and secondary means are each linearly responsive to said at least one drive signal.

11. The system according to claim 8 comprising:
 a) means, coupled to said secondary means, being responsive to said at least one drive signal, to said primary signal, and to an information signal for producing at least one intermediate signal and said at least one secondary input signal; and
 b) means, coupled to said secondary response subsystem, being responsive to said at least one intermediate signal and to said secondary signal for deriving said information signal.

12. The system according to claim 5 further comprising:
 secondary means coupled to said primary system being responsive to said at least one drive signal for generating at least one secondary input signal; and
 wherein said secondary response subsystem comprises means responsive to said at least one secondary input signal for producing said secondary signal.

13. The system according to claim 12 wherein said secondary means is linearly responsive to said at least one drive signal.

14. The system according to claim 5 wherein said primary and secondary response subsystems respectively produce chaotic primary and secondary signals.

15. The system according to claim 5 further comprising:
 nonlinear dynamical feedback output means coupled to said primary response subsystems and responsive to said at least one drive signal for producing at least one feedback signal; and
 wherein said drive subsystem comprises means responsive to said at least one feedback signal for producing said at least one drive signal.

16. The system according to claim 5 further comprising:
 a) means, coupled to said primary response subsystems, being responsive to said primary signal and to an information signal for producing at least one intermediate signal; and
 b) means, coupled to said secondary response subsystem, being responsive to said at least one intermediate signal and to said secondary signal for deriving said information signal.

17. The system according to claim 5 wherein said primary and secondary response subsystems respectively have at least one primary parametric value and at least one secondary parametric value, said at least one primary and at least one secondary parametric values being within about 10% of each other.

* * * * *